(12) United States Patent
Gajek et al.

(10) Patent No.: US 10,608,047 B1
(45) Date of Patent: Mar. 31, 2020

(54) MAGNETIC MEMORY ELEMENT WITH VOLTAGE CONTROLLED MAGNETIC ANISTROPY

(71) Applicant: Spin Memory, Inc., Fremont, CA (US)

(72) Inventors: Marcin Gajek, Berkeley, CA (US); Kuk-Hwan Kim, San Jose, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

(21) Appl. No.: 16/147,242

(22) Filed: Sep. 28, 2018

(51) Int. Cl.
| | | |
|---|---|---|
| *G11C 11/00* | (2006.01) | |
| *H01L 27/22* | (2006.01) | |
| *H01L 43/02* | (2006.01) | |
| *G11C 11/16* | (2006.01) | |
| *H01L 43/12* | (2006.01) | |
| *H01L 43/10* | (2006.01) | |

(52) U.S. Cl.
CPC .......... *H01L 27/228* (2013.01); *G11C 11/161* (2013.01); *G11C 11/1673* (2013.01); *G11C 11/1675* (2013.01); *H01L 43/02* (2013.01); *H01L 43/12* (2013.01); *H01L 43/10* (2013.01)

(58) Field of Classification Search
CPC ..................................................... G11C 11/161

USPC ........................................................ 365/158
See application file for complete search history.

(56) References Cited

U.S. PATENT DOCUMENTS

2013/0135772 A1* 5/2013 Ahn .................... G11B 5/3163
360/125.02

* cited by examiner

*Primary Examiner* — Hoai V Ho
(74) *Attorney, Agent, or Firm* — Zilka-Kotab, P.C.

(57) ABSTRACT

A magnetic memory element having voltage controlled magnetic anisotropy for active control of switching energy (delta). The magnetic memory element can be formed as a pillar structure having a magnetic free layer a magnetic reference layer and a non-magnetic barrier layer located between the magnetic free layer and the magnetic reference layer. A dielectric wall is formed around the side of the magnetic free layer and an electrically conductive program line is formed around the dielectric wall, such that the dielectric wall separates the program line from the magnetic free layer. The electrically conductive program line is electrically connected with circuitry to selectively apply a gate voltage to the electrically conductive program line and across the dielectric layer. The circuitry can include a voltage source switching circuitry such as a transistor. The gate voltage advantageously reduces perpendicular magnetic anisotropy in the magnetic free layer, thereby reducing switching energy.

9 Claims, 16 Drawing Sheets

MAGNETIC MEMORY ELEMENT WITH VOLTAGE CONTROLLED MAGNETIC ANISTROPY

FIELD OF THE INVENTION

The present invention relates to magnetic random access memory (MRAM) and more particularly to a magnetic memory element having a structure for selectively adjusting free layer switching delta using voltage controlled magnetic anisotropy control.

BACKGROUND

Magnetic Random Access Memory (MRAM) is a non-volatile data memory technology that stores data using magnetoresistive cells such as Magnetoresistive Tunnel Junction (MTJ) cells. At their most basic level, such MTJ elements include first and second magnetic layers that are separated by a thin, non-magnetic layer such as a tunnel barrier layer, which can be constructed of a material such as Mg—O. The first magnetic layer, which can be referred to as a reference layer, has a magnetization that is fixed in a direction that is perpendicular to that plane of the layer. The second magnetic layer, which can be referred to as a magnetic free layer, has a magnetization that is free to move so that it can be oriented in either of two directions that are both generally perpendicular to the plane of the magnetic free layer. Therefore, the magnetization of the free layer can be either parallel with the magnetization of the reference layer or anti-parallel with the direction of the reference layer (i.e. opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. An electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free and reference layer are oriented in the same direction, the majority spin of the electrons in the free layer are is in the same direction as the orientation of the majority spin of the electrons in the reference layer. Because these electron spins are in generally the same direction, the electrons can pass relatively easily through the tunnel barrier layer. However, if the orientations of the magnetizations of the free and reference layers are opposite to one another, the spin of majority electrons in the free layer will be generally opposite to the majority spin of electrons in the reference layer. In this case, there are not enough electronic states available in the next electrode and the electrons cannot easily pass through the barrier layer, resulting in a higher electrical resistance through the MTJ stack.

Because the MTJ element can be switched between low and high electrical resistance states, and remain in that state even when the current is turned off, it can be used as a memory element to store a bit of data. For example, the low resistance state can be read as an on or "1", whereas the high resistance state can be read as a "0". In addition, because the magnetic orientation of the magnetic free layer remains in its switched orientation without any electrical power to the element, it provides a robust, non-volatile data memory bit.

To write a bit of data to the MTJ cell, the magnetic orientation of the magnetic free layer can be switched from a first direction to a second direction that is 180 degrees from the first direction. This can be accomplished, for example, by applying a current through the MTJ element in a direction that is perpendicular to the planes of the layers of the MTJ element. An electrical current applied in one direction will switch the magnetization of the free layer to a first orientation, whereas switching the direction of the current and such that it is applied in a second direction will switch the magnetization of the free layer to a second, opposite orientation. Once the magnetization of the free layer has been switched by the current, the state of the MTJ element can be read by reading a voltage across the MTJ element, thereby determining whether the MTJ element is in a "1" or "0" bit state. Advantageously, once the switching electrical current has been removed, the magnetic state of the free layer will remain in the switched orientation until such time as another electrical current is applied to again switch the MTJ element. Therefore, the recorded date bit is non-volatile in that it remains intact in the absence of any electrical power.

SUMMARY

The present invention provides a magnetic memory element for use in a magnetic memory array. The memory element includes a magnetic free layer having a side, a magnetic reference layer, and a non-magnetic barrier layer located between the magnetic free layer and the magnetic reference layer. The memory element also includes a dielectric wall formed at the side of the magnetic free layer and an electrically conductive layer formed such that the dielectric layer separates the electrically conductive layer from the magnetic free layer.

The electrically conductive layer can be part of a program line that is connected with circuitry to selectively supply a gate voltage during a write mode and remove the gate voltage during a read mode. The circuitry can include a voltage source and switching circuitry for selectively connecting and disconnecting a voltage from the voltage source. The switching circuitry can include transistor circuitry. Both the dielectric layer and the electrically conductive layer can be configured to form a ring structure that surrounds at least the magnetic free layer.

A voltage supplied to the electrically conductive layer provides a gate voltage to the sides of the magnetic free layer across the dielectric wall. This gate voltage results in an interfacial magnetic anisotropy that increases in-plane magnetic anisotropy and thereby reduces a perpendicular magnetic anisotropy in the magnetic free layer. This reduction in perpendicular magnetic anisotropy in the magnetic free layer advantageously reduces the switching energy required to switch the magnetic state of the magnetic free layer during writing. During a read mode, the gate voltage can be removed to advantageously increase the switching energy needed to switch the magnetic state of the magnetic free layer, thereby improving data retention and thermal and magnetic stability and hence leading to a significant reduction in read disturb.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
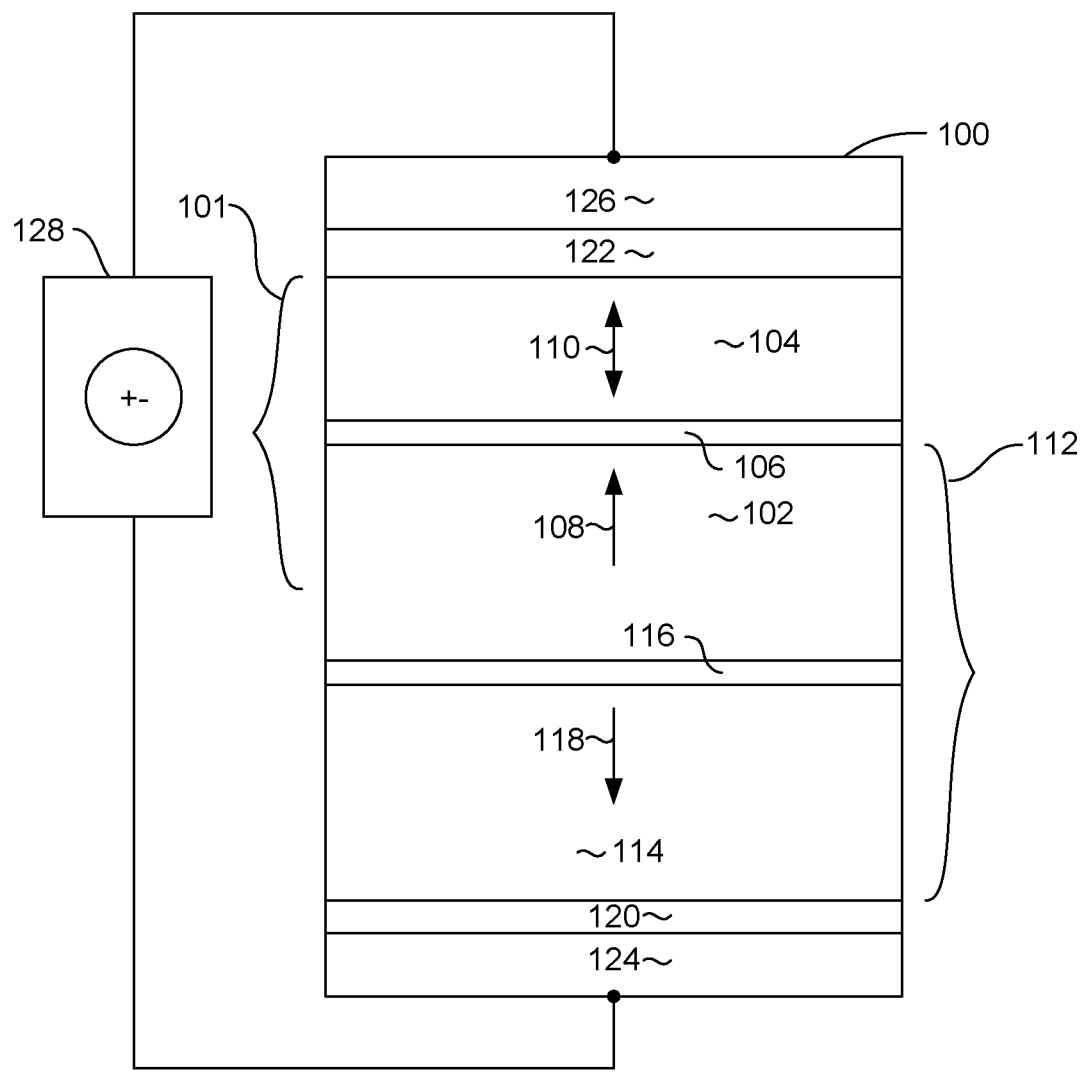
FIG. 1 is a schematic, cross sectional view of a perpendicular magnetic tunnel junction (pMTJ) element.

Referring now to FIG. 1, a magnetic memory element 100 can be in the form a of a perpendicular magnetic tunnel junction (pMTJ) memory element. The magnetic memory element can include an MTJ 101 that can include a magnetic reference layer 102, a magnetic free layer 104 and a thin, non-magnetic, electrically insulating magnetic barrier layer 106 located between the magnetic reference layer 102, and magnetic free layer 104. The barrier layer 106 can be an oxide such as MgO. The magnetic reference layer has a magnetization 108 that is fixed in a direction that is preferably perpendicular to the plane of the layers as indicated by arrow 108. The magnetic free layer has a magnetization 110 that can be in either of two directions perpendicular to the plane of the layer 104. While the magnetization 110 of the free layer 104 remains in either of two directions perpendicular to the plane of the layer 104 in a quiescent state, it can be moved between these two directions as will be described in greater detail herein below. When the magnetization 110 of the magnetic free layer 104 is in the same direction as the magnetization 108 of the reference layer 102, the electrical resistance across the layers 102, 106, 104 is at a low resistance state. Conversely, when the magnetization 110 of the free layer 104 is opposite to the magnetization 108 of the reference layer 102, the electrical resistance across the layers 102, 106, 104 is in a high resistance state.

The magnetic reference layer 102 can be part of an anti-parallel magnetic pinning structure 112 that can include a magnetic keeper layer 114, and a non-magnetic, antiparallel coupling layer 116 located between the keeper layer 114 and reference layer 102. The antiparallel coupling layer 116, which will be described in greater detail herein below, can be constructed to have a thickness such that it will couple the layers 114, 102 in antiparallel configuration. The antiparallel coupling between the layers 114, 102 ensures that the magnetization 108 of the reference layer 102 is in a direction opposite to the direction of magnetization 118 of the keeper layer 114.

A seed layer 120 may be provided near the bottom of the memory element 100 to initiate a desired crystalline structure in the above deposited layers. A capping layer 122 may be provided near the top of the memory element 100 to protect the underlying layers during manufacture, such as during high temperature annealing and from exposure to ambient atmosphere. Also, electrodes 124, 126 may be provided at the top and bottom of the memory element 100. The electrodes 124, 126 may be constructed of a non-magnetic, electrically conductive material such as Ta, W, Cu and Al can provide electrical connection with circuitry 128 that can include a current source and can further include circuitry such as CMOS circuitry for reading an electrical resistance across the memory element 100.

The magnetic free layer 104 has a perpendicular magnetic anisotropy that causes the magnetization 110 of the free layer 104 to remain stable in one of two directions perpendicular to the plane of the free layer 104. In a write mode, the orientation of the magnetization 110 of the free layer 104 can be switched between these two directions by applying an electrical current through the memory element 100 from the circuitry 128. A current in one direction will cause the memory element to flip to a first orientation, and a current in an opposite direction will cause the magnetization to flip to a second, opposite direction. For example, if the magnetization 110 is initially oriented in a downward direction in FIG. 1, applying a current in a downward direction through the element 100 will cause electrons to flow in an opposite direction upward through the element 100. The electrons travelling through the reference layer will become spin polarized as a result of the magnetization 108 of the reference layer 102. These spin polarized electrons cause a spin torque on the magnetization 110 of the free layer 104, which causes the magnetization to flip directions.

On the other hand, if the magnetization 110 of the free layer 104 is initially in an upward direction in FIG. 1, applying an electrical current through the element 100 in an upward direction will cause electrons to flow in an opposite direction, downward through the element 100. However, because the magnetization 110 of the free layer 104 is opposite to the magnetization 108 of the reference layer 102, the electrons with an opposite spin will not be able to efficiently pass through the barrier layer 106 to the reference layer 102. As a result, the electrons having an opposite spin will accumulate at the junction between the free layer 104 and barrier layer 106. This accumulation of spin polarized electrons causes a spin torque that causes the magnetization 110 of the free layer 104 to flip from a downward direction to an upward direction.

Figure 2:
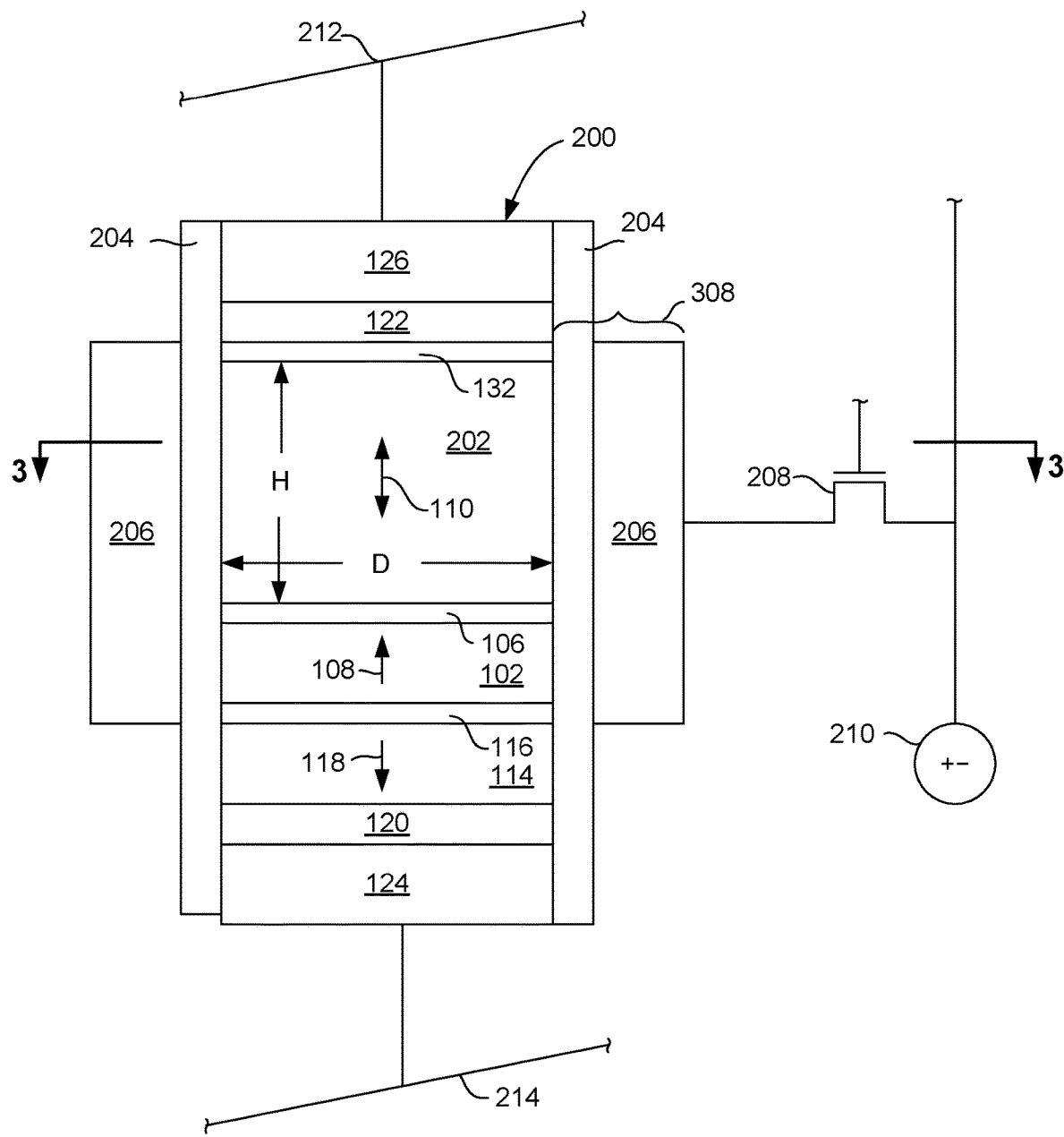
FIG. 2 is an enlarged, schematic, cross sectional view of magnetic memory element according to an embodiment.

FIG. 2 shows an enlarged view of a magnetic memory element 200 according to an embodiment. The memory element 200 includes structure and circuitry that is configured to provide a voltage controlled, selectively adjustable free layer magnetic anisotropy as will be discussed.

As with the previously described embodiment, the memory element includes a magnetic free layer 202, a magnetic reference layer 102 and a non-magnetic barrier layer 206 located between the magnetic free layer 202 and the magnetic reference layer 102. The barrier layer 106 can be constructed of a material such as MgO. The magnetic reference layer 102 can be constructed of a magnetic material such as one or more layers of CoFeB coupled to a composite reference layer made out of multilayers such as Co/Pt or Co/Pd. The magnetic free layer 202 also can be constructed of CoFeB.

The magnetic reference layer 102 has a magnetization that is pinned in a perpendicular direction (perpendicular to the layer 102) as indicated by arrow 108. The reference layer 102 can be part of a synthetic antiferromagnetic structure that also includes a pinned or keeper layer 114 and an antiparallel coupling layer 116. The antiparallel coupling layer 116 can be constructed of a material such as Ru, having a thickness that is chosen to antiparallel couple the magnetic layers 102, 114. The keeper layer 114 has a magnetization 118 that is oriented in a perpendicular direction and that is opposite to the direction of magnetization 108 of the reference layer 102.

The magnetic free layer 202 has a height H and a diameter D that define an aspect ratio H/D. The magnetic free layer 202 preferably has a relatively high aspect ratio H/D of 2 to 3. This aspect ratio is selected to provides a shape enhanced perpendicular magnetic anisotropy in a perpendicular direction (e.g. vertical as shown in FIG. 2, and indicated by arrow 110). This causes the magnetic free layer to have a magnetization that can be stable in either of to perpendicular directions and which can be switched between these two perpendicular directions as indicated by arrow 110.

The magnetic recording element can also include a seed layer 120 at its bottom that is formed of a material that is chosen to initiate a desired grain structure in the above deposited layers, and a capping layer 122 formed of a material such as Ta, W, TaN, etc. to protect the underlying layers during manufacture. Electrically conductive lead layers 126, 124 may be provided at the top and bottom of the memory element respectively to provide electrical connection to read and write circuitry. One lead 126 can be connected with a bit line 212, while the other lead 124 can be connected with a word/source line 214.

Writing and reading data to a magnetic memory element such as the magnetic memory element 200 requires a balancing of competing interests. For writing data to a magnetic element 200 by switching the magnetization 110 of the magnetic free layer 202 it is desirable that the memory element 200 have a low delta, wherein delta refers to the amount of energy needed to switch the magnetization 110 from one direction to an opposite direction. In order to for this delta (e.g. switching energy) to be low, the magnetic free layer 202 can have a reduced perpendicular magnetic anisotropy.

However, in order for the magnetic state of the memory element 200 to remain stable after a bit of data has been written to the memory element 200 it is desirable that the magnetic memory have a high delta, such that a high switching energy is required to switch the magnetization 110 of the magnetic free layer 202. Therefore, a high delta is desired during reading mode. Therefore, design of a magnetic element 200 has required a balancing of competing interests of having a sufficiently high delta to ensure that a recorded bit is stable during reading and having a sufficiently low delta to allow the magnetic state of the magnetic free layer 202 to be switched during writing, especially without requiring a sufficiently high write current that cause thermal damage to the barrier layer 106.

The present invention, an embodiment of which is described with reference to FIG. 2, overcomes this dilemma, by providing a mechanism for changing the switching energy (delta) as desired for either read or write mode. As seen in FIG. 2, the memory element 200 includes a wall 204 that is constructed of a dielectric material and which surrounds the various layers of the memory element 200, especially the magnetic free layer 202. The dielectric wall 204 can be constructed of a high k dielectric material and is preferably formed of the same material as the barrier layer 106, such as MgO. An electrically conductive structure 206 surrounds at least a portion of the dielectric wall 204 such that the dielectric wall 204 separates the electrically conductive structure 206 from the other layers of the memory element 200 such as from the magnetic free layer 202, barrier layer 106 and reference layer 102. The electrically conductive structure 206 can be formed as a layer of electrically conductive material such as Al, that surrounds the dielectric wall 204 in the region adjacent to the magnetic free layer 202. The electrically conductive structure 206 can also extend to areas adjacent to other layers of the memory element 200 such as adjacent to the magnetic reference layer 102 and/or the barrier layer 106.

The electrically conductive structure 206 can function as a program line for controlling the switching energy as will described in greater detail herein below, and will be referred to herein as "program line" 206, although the program line 206 could be formed of various shapes and configurations.

Figure 3:
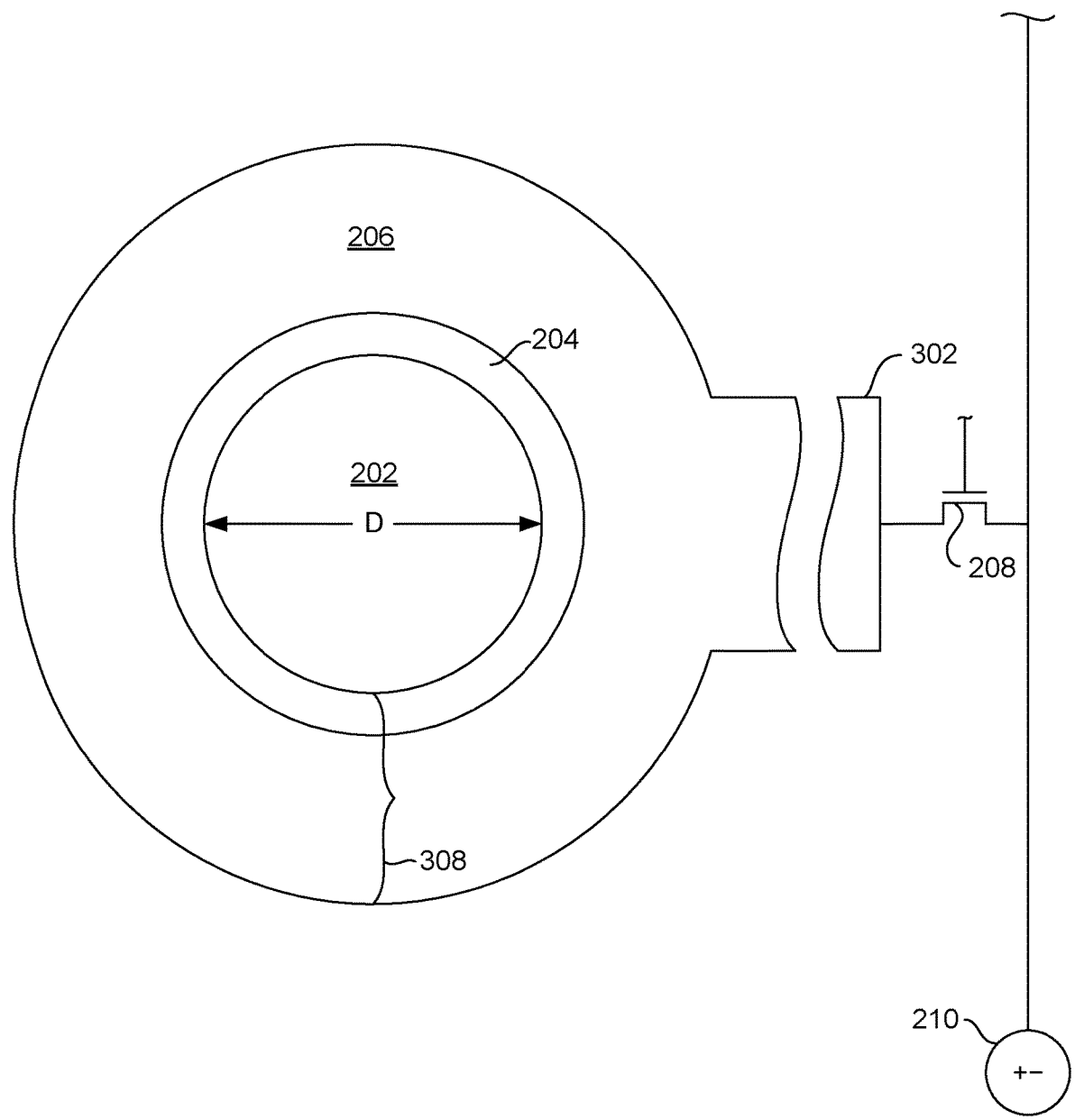
FIG. 3 is a top-down, cross-sectional as seen from line 3-3 of FIG. 2.

An exemplary structure of the dielectric wall 204 and program line 206 can be better understood with reference to FIG. 3 which shows a top-down, cross-sectional view, taken from the location of the magnetic free layer 202, as seen from line 3-3 of FIG. 2. As can be seen in FIG. 3, the layers of the memory element structure 200 (including the magnetic free layer 202 can be formed as a cylindrical pillar. The dielectric wall 204 can be formed as a ring around the magnetic free layer 202 as well as around other layers of the magnetic memory element pillar structure 200. The dielectric wall 204 can be formed of a high k dielectric material such as MgO or HfO$_2$. and can be relatively thick. For example, the dielectric wall can have a thickness greater than 1 nm. The program line 206 surrounds the magnetic free layer (and possible other layers of the memory element pillar structure 200) and also extends laterally to form a lead line 302.

With reference to both FIGS. 2 and 3, the program line 206/302 can be electrically connected with switching circuitry such as a program selector transistor 208. The program selector transistor 208 can selectively connect and disconnect the program line 206/302 with a power source 210. The voltage source is preferably a low power, high voltage generation sources. In FIGS. 2 and 3, the power source 210 is connected with a lead line 304 that is shown extending beyond the program selector 208 and lead 206/302. This is to indicate that the power source 210 can also be connected in parallel with other program lines related to other memory element structures in an array of such structures (not shown in FIGS. 2 and 3).

The dielectric wall 204 and the surrounding program line 206 together form a sidewall gate structure 308. When, the program selector transistor 208 is activated so as to connect the program line 206/302 with the power source 210 a gate voltage is established at the location of the magnetic free layer 202. This gate voltages induces an additional interfacial magnetic anisotropy at the side of the magnetic free layer that promotes an in plane magnetic anisotropy in the magnetic free layer. This additional in-plane magnetic anisotropy reduces the switching energy needed to switch magnetic states of the magnetic free layer 202 by decreasing the relative ratio of perpendicular magnetic anisotropy to in plane magnetic anisotropy in the magnetic free layer 202. When the program transistor 208 is switched off, the gate voltage is removed and the ratio of perpendicular to in plane magnetic anisotropy in the magnetic free layer again increases to thereby increase the switching energy (delta) needed to switch the magnetic states of the magnetic free layer 202.

Therefore, the switching energy (delta) needed to switch the magnetic state of the magnetic free layer 202 can be selectively controlled between a relatively high switching energy and a relatively low switching energy at will by applying or removing the gate voltage at the program line 206. During a write state, when a lower switching energy is desired to more easily switch the magnetic state of the magnetic free layer 202 the gate voltage can be applied by switching "on" the program transistor 208. Conversely, during a "read" mode, the gate voltage can be removed by switching off the program transistor 208, thereby increasing the switching energy (delta) and ensuring that a previously recorded bit of data remains stable.

This advantageously improves both write error rate and read error rate, while allowing switching at a lower switching energy so as to avoid thermally stressing the barrier layer 106. Because the switching energy can be selectively reduced during writing as described above, the magnetic free layer 202 can be designed with a shape that induces a shape enhanced perpendicular magnetic anisotropy. As described with reference to FIGS. 2 and 3, the magnetic free layer 202 has a height H measured in the perpendicular direction (i.e. vertical in FIG. 2) and has a diameter D. The height H divided by the diameter D defines an aspect ratio H/D. Because the relative switching energy can be selectively reduced as described above, the magnetic free layer 202 can have a higher aspect ratio producing increased perpendicular shape enhanced magnetic anisotropy, while still allowing writing at an acceptably low switching energy. For example, the magnetic free layer 202 can be designed with an aspect ratio H/D of xxx. By way of example, the magnetic free layer 202 could have a height H of 8-15 nm or about 10 nm and could have a diameter D of 16-30 nm. Such an increased aspect ratio and corresponding increased perpendicular magnetic anisotropy would be hardly feasible without the above described selective control of magnetic anisotropy and switching energy (delta) provided by the gate structure 204, 206, because the increased perpendicular magnetic anisotropy would result in a high switching energy and due to the restricted barrier surface area a corresponding high voltage drop and hence dielectric breakdown damage to the barrier layer 106 during switching.

Figure 4A:
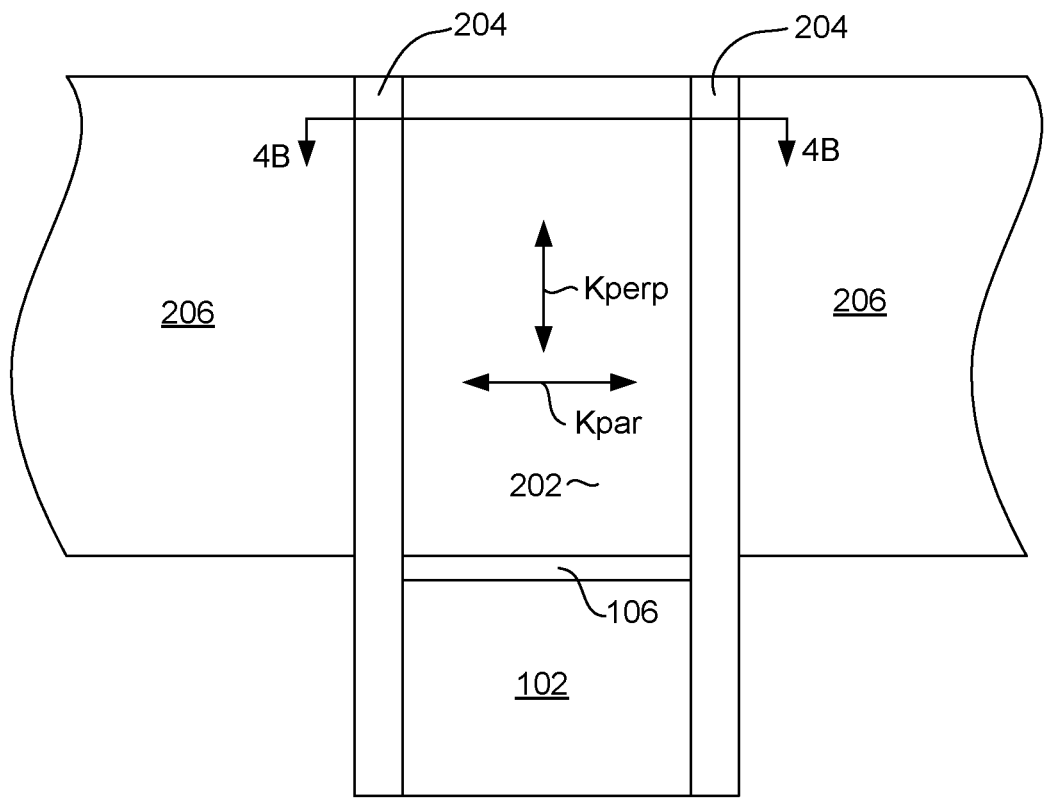
FIG. 4A is a side cross-sectional view of a portion of a magnetic memory element with a voltage controlled magnetic anisotropy structure, illustrating a relationship between element dimensions and magnetic anisotropy.
Figure 4B:
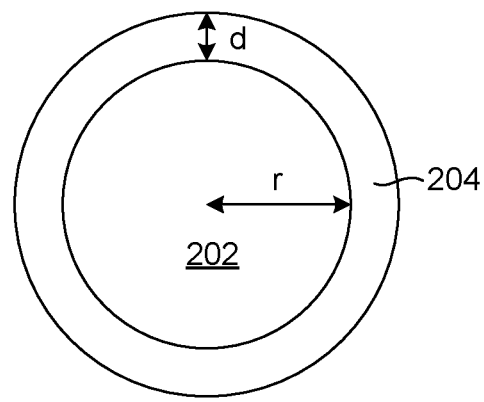
FIG. 4B is a top-down, cross-sectional view as seen from line 4B-4B of FIG. 4A.

FIG. 4A shows a side cross-sectional, schematic view of a free layer 202 and surrounding dielectric wall 204 and program line 206, and FIG. 4B shows a top down cross-sectional schematic view of the magnetic free layer 202 and dielectric wall 204 as seen from line 4B-4B of FIG. 4A in order to illustrate how voltage control of magnetic anisotropy is affected by structure geometry. As shown in FIG. 4B, the free layer has a radius "r" and the dielectric wall 204 has a thickness "d". The magnetic free layer 202 has a perpendicular magnetic anisotropy indicated by vertical, double ended arrow Kperp in FIG. 4A and an in plane magnetic anisotropy indicated by horizontal, double ended arrow Kpar in FIG. 4A. The perpendicular magnetic anisotropy Kperp is a combination of magnetic anisotropies that include a shape enhanced anisotropy, an interfacial anisotropy resulting the horizontal interface with the barrier layer 106, and a bulk anisotropy.

The parallel (in plane) magnetic anisotropy Kpar is effected by an interfacial anisotropy resulting from the interface between the outer sides of the magnetic free layer 202 and the dielectric wall 204, which varies depending upon the amount of gate voltage applied by the program line 206 across the dielectric wall 204. The interfacial energy Ki is a function of the materials set, and has a complex derivation. However, the magnetic energy of the free layer 104 can be affected by the shape of the magnetic free layer. The thermal stability of the magnetic free layer is affected by various factors including the shape of the magnetic free layer 104 as discussed in an article entitled: *Highly Thermally Stable Sub-20 nm Magnetic Random-Access Memory Based on OPerpendicular Shape Anisotropy*, N. Perrissin1, S. Lequeux1, N. Strelkov1,2, L. Vila1, L. Buda-Prejbeanu1, S. Auffret1, R. C. Sousa1, I. L. Prejbeanu1, B. Dieny1 (1) Univ. Grenoble Alpes, CEA, CNRS, Grenoble INP*, INAC-SPINTEC, 38000 Grenoble, France (2) Department of Physics, Lomonosov Moscow State University, Moscow 119991, Russia *Institute of Engineering Univ. Grenoble Alpes.

Figure 5A:
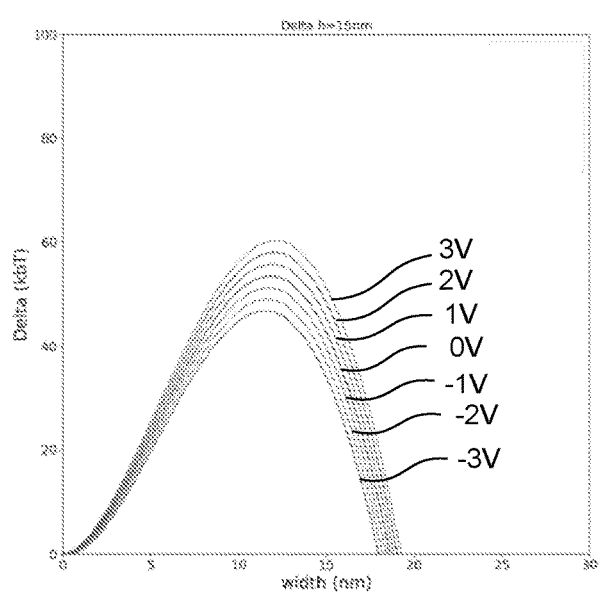
FIG. 5A is a graph showing switching energy (delta) as a function of free layer width for various gate voltages.

FIG. 5A shows a graph of switching energy (delta) as a function of free layer width for various gate voltages applied by a program line 206 across the dielectric wall 204 (FIG. 2). As can be seen, in FIG. 5A, a variation in gate voltage from −3V to 3 V at a free layer width of about 12 nm, results in variation in delta from about 42 kbT to about 60 kbT or about a 20 percent variation in switching energy delta.

Figure 5B:
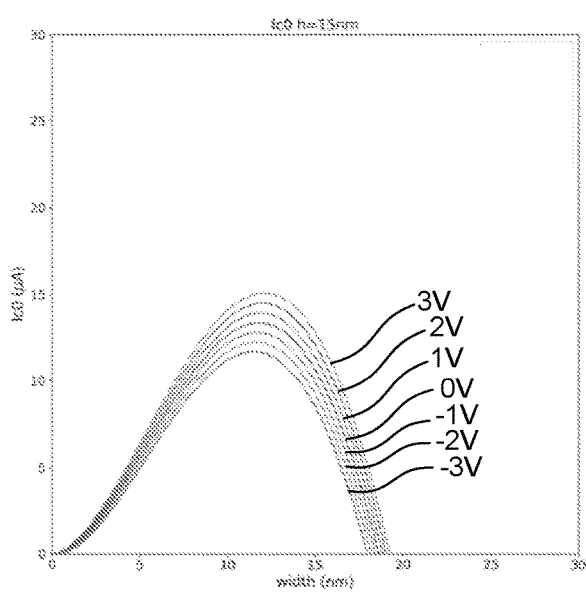
FIG. 5B is a graph showing Ic0 or the limit switching current at a pulse width of 1 ns as a function of free layer width for various gate voltages.

FIG. 5B shows a graph of switching current at 1 ns as a function of magnetic free layer width for various gate voltages. As can be seen in FIG. 5B, the switching surrender can vary between about 15 uA to about 10 uA with a variation in gate voltage of 3V to −3V. This represents a change in switching current of about 33 percent. Therefore, it can be seen that the above described gate structure can provide a very significant control of switching energy or magnetic anisotropy resulting in a large modulation of switching current in a memory element array structure.

Figure 6:
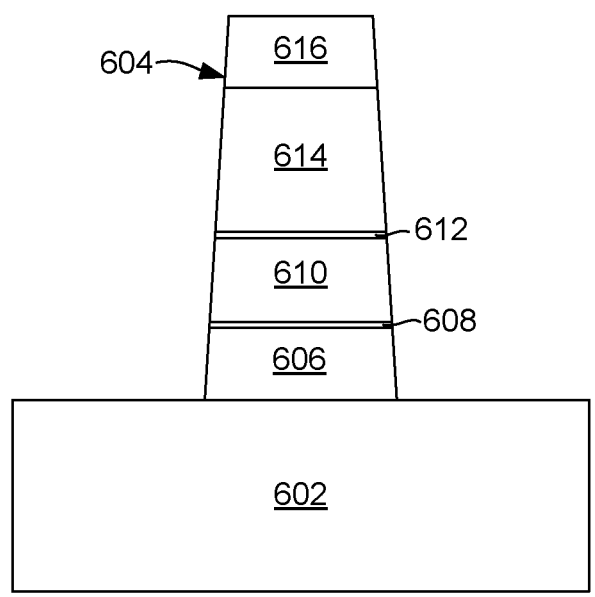
FIGS. 6-16 are schematic views of a magnetic memory element in various intermediate stages of manufacture in order to illustrate a method for manufacturing a magnetic memory element according to an embodiment.

FIGS. 6-16 show a magnetic memory element in various intermediate stages of manufacture in order to illustrate a method for manufacturing a magnetic memory element array having voltage controlled magnetic anisotropy for control of switching energy (delta). With reference to FIG. 6, a substrate 602 is provided. The substrate can be a bottom lead structure formed on a wafer such as a semiconductor wafer. A memory element structure 604 is formed over the substrate 602. The memory element structure 604 can include an antiferromagnetic structure including a magnetic keeper layer 606 a non-magnetic antiparallel coupling layer 608, and a magnetic reference layer 610. A non-magnetic barrier layer 612 such as MgO can be formed over the magnetic reference layer 610 and a magnetic free layer 614 can be formed over the barrier layer 612. A capping layer 616 can be included over the magnetic free layer 614. Other layers (not shown), may also be included over the magnetic free layer 614, such as a spin current structure and coupling layer. In addition, the order of the described layers could be altered such as by having the magnetic free layer 614 located beneath the magnetic reference layer 610. The magnetic element structure 604 can be formed by depositing the various layers 606-616 and then forming a mask structure and performing an ion milling or other material removal process to form the memory element 604 as a pillar structure. It should also be pointed many thousands of such memory element pillars 604 can be formed on a single wafer.

Figure 7:
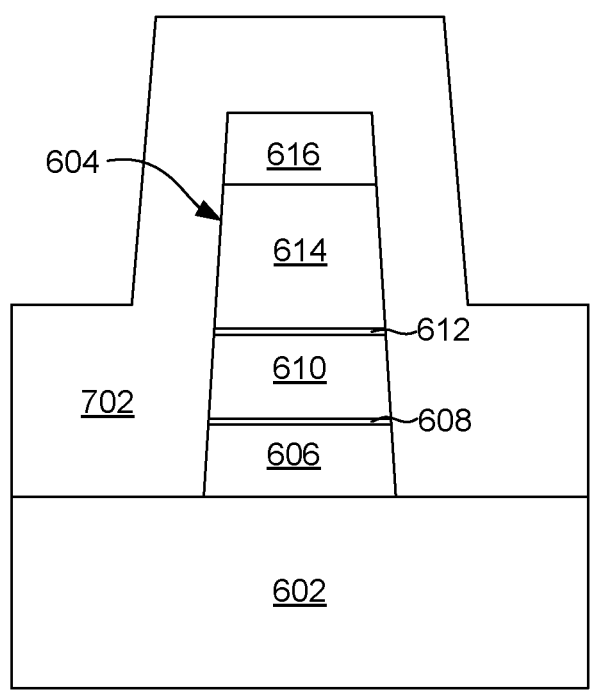

With reference now to FIG. 7, a dielectric material 702 is deposited. The dielectric material 702 is preferably a high-k dielectric material and is preferably the same material as the barrier layer 612, such as preferably MgO. The dielectric layer 702 could also be some other material such as HfO or any other material that is known to induce an interfacial anisotropy with CoxFe1−x. This interfacial magnetic anisotropy contribution arises from the O—Fe bonding at the dielectric/magnetic layer interface. The dielectric material 702 can be deposited by a process such as plasma vapor deposition (PVD) or atomic layer deposition (ALD). A material removal process is then performed to preferentially remove vertically disposed portions of the dielectric material 702. The material removal process can be a process such as reactive ion etching or ion beam etching. If ion beam etching is performed, the ion beam etching can be performed at a non-normal angle, preferably at a glancing angle in order to preferentially remove portions of the dielectric material 702 that are formed at the sides of the memory element pillar 604.

Figure 8:
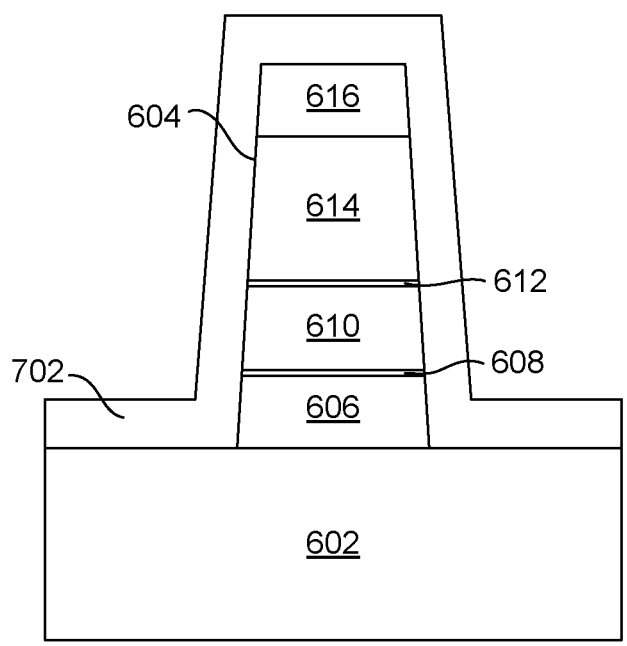
Figure 9:
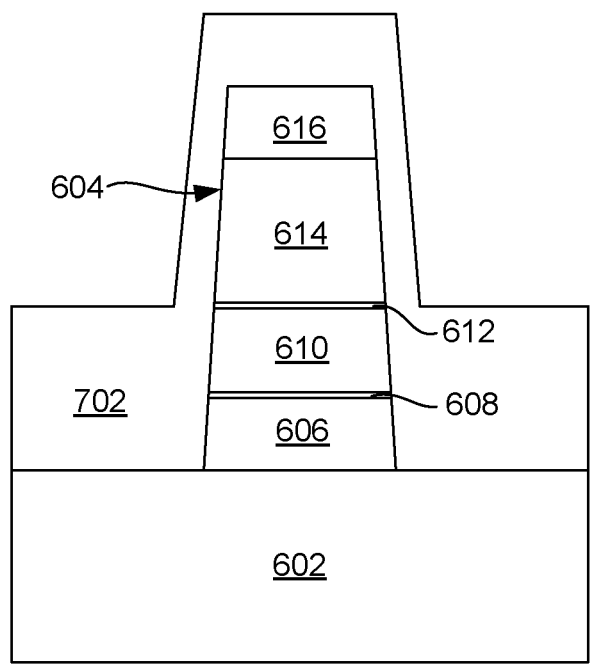

This process of depositing dielectric material 702 and performing a material removal process can be repeatedly performed until a structure such as that shown in FIG. 9 is formed. As shown in FIG. 8, the dielectric material 702 has a thick bottom portion that can have a height that is substantially at the level of the reference layer 610 or substantially at the height of the barrier layer 612, whereas the dielectric material 702 forms a thinner side wall at the sides of the free layer 614.

Figure 10:
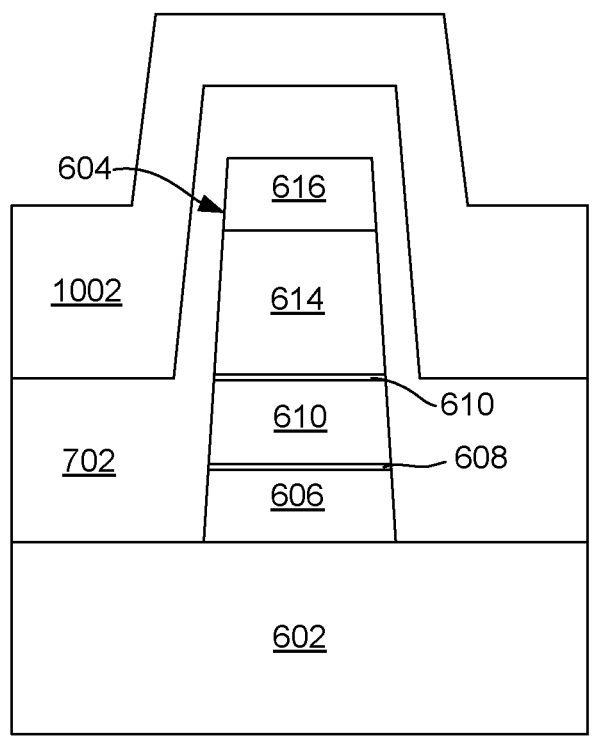
Figure 11:
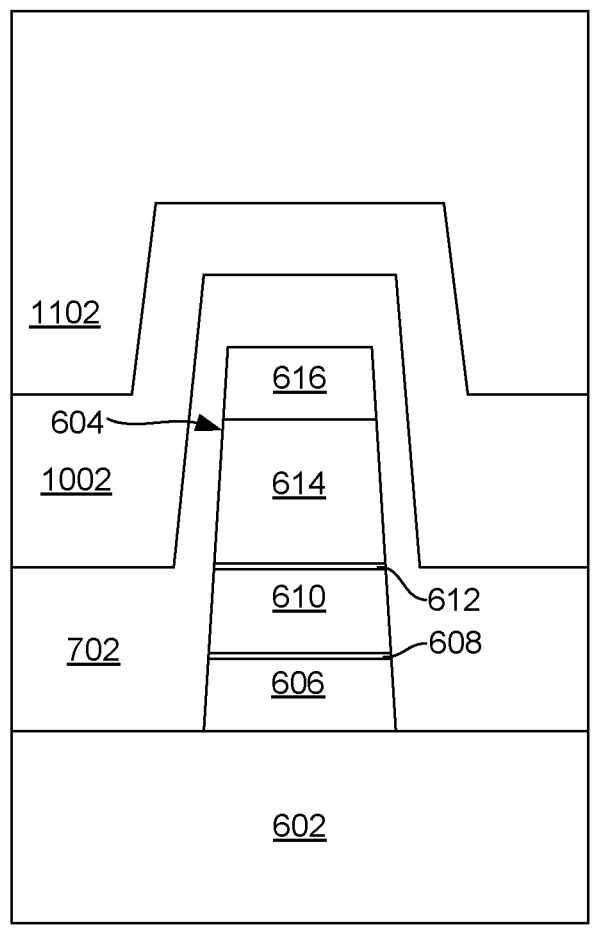
Figure 12:
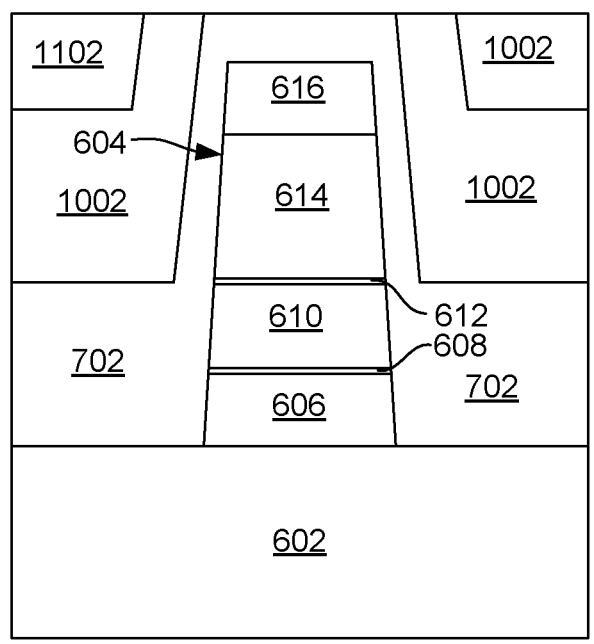

With reference now to FIG. 10, an electrically conductive metal 1002 is deposited. The electrically conductive metal can be a material such as Al or some other electrically conductive metal, and is deposited over the dielectric layer 702. Then, with reference to FIG. 11, another layer of dielectric material 1102 is deposited over the electrically conductive metal layer 1002. This second layer of dielectric material 1102 can a material such as SiOx or $Si_3N_4$. Then, a chemical mechanical polishing process can be performed to planarize the surface of the deposited layer, leaving a structure such as that shown in FIG. 12.

Figure 13:
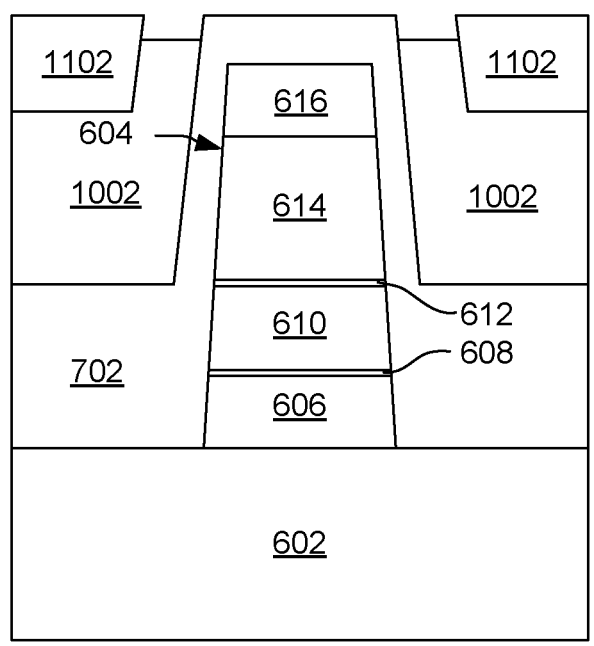

A reactive ion etching (RIE) can then be performed. The reactive ion etching is preferably performed using a chemistry that is chosen to selectively remove the metal 1002 at a faster rate than the dielectric layers 702, 1102, thereby leaving a structure as shown in FIG. 13, with the electrically conductive metal 1002 being recessed relative to the dielectric layers 702, 1102.

Figure 14:
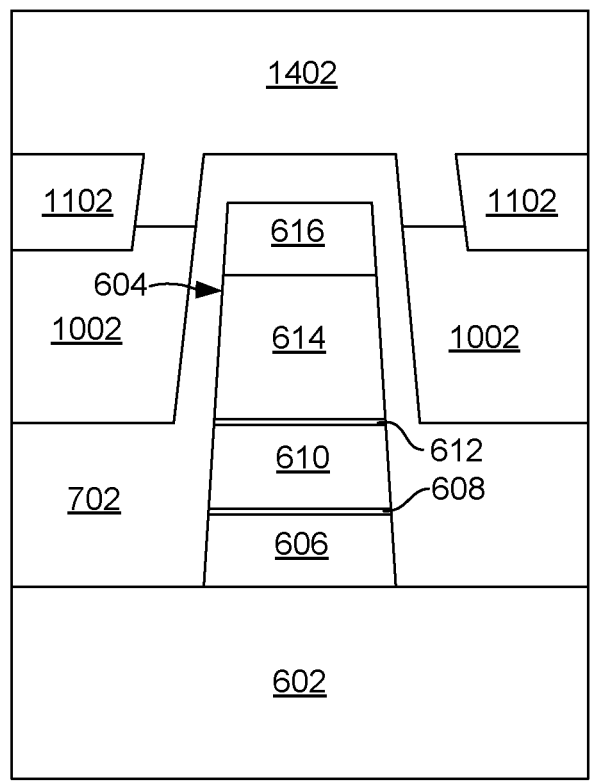
Figure 15:
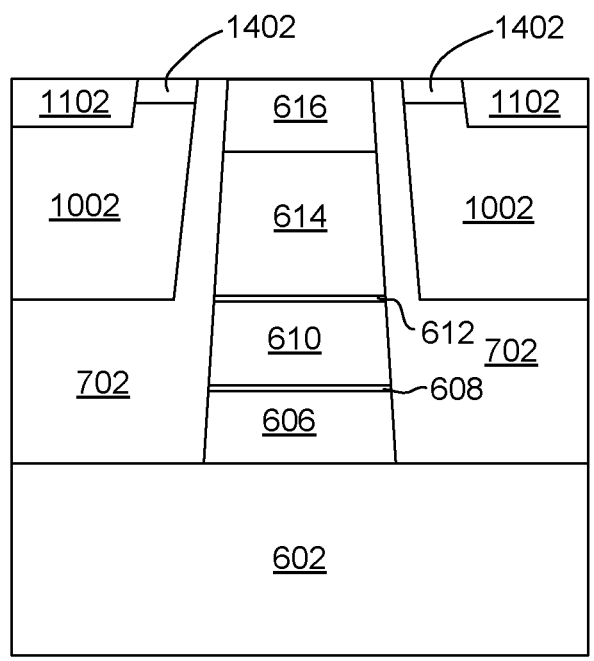
Figure 16:
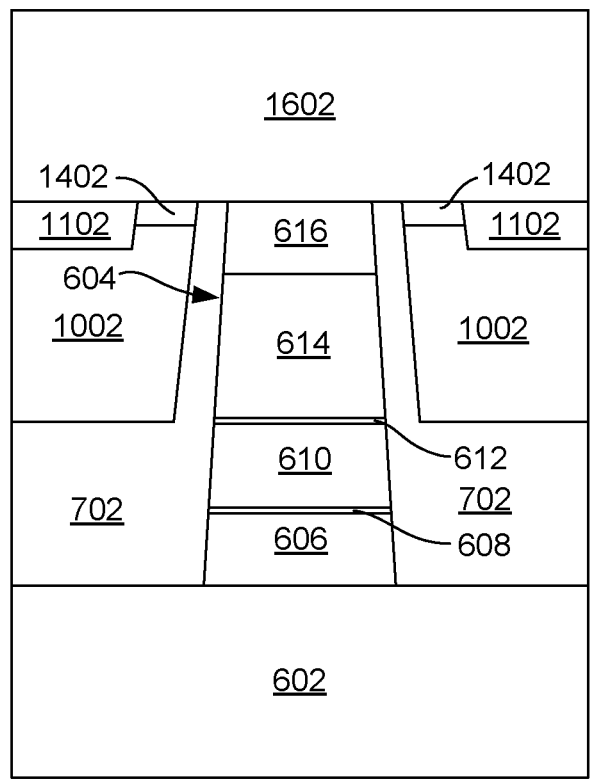

With reference now to FIG. 14, another (third) layer of dielectric material 1402 is deposited. Then, another chemical mechanical polishing (CMP) is performed, leaving a structure such at that shown in FIG. 15. The CMP process is preferably performed sufficiently to expose the top of the memory element pillar 604, such as by exposing the capping layer 616. Then, with reference to FIG. 16, an upper lead 1602 is formed by depositing an electrically conductive lead layer to be in electrical contact with the top of the memory element pillar 604.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments but should be defined only in accordance with the following claims and their equivalents.

What is claimed is:

1. A magnetic memory element, comprising:
   a magnetic reference layer;
   a magnetic free layer having a side;
   a non-magnetic barrier layer located between the magnetic free layer and the magnetic reference layer;
   a dielectric wall formed at the side of the magnetic free layer; and
   an electrically conductive layer formed such that the dielectric wall separates the electrically conductive layer from the side of the magnetic free layer.

2. The magnetic memory element as in claim 1, wherein the dielectric wall and the electrically conductive layer form a gate structure.

3. The magnetic memory element as in claim 1, wherein the electrically conductive layer is electrically connected with a voltage source to apply a gate voltage to the electrically conductive layer.

4. The magnetic memory element as in claim 1, wherein the electrically conductive layer is electrically connected with a voltage source and switching circuitry for selectively applying a gate voltage to the dielectric wall and the magnetic free layer.

5. The magnetic memory element as in claim 1, wherein the dielectric wall surrounds the magnetic free layer and the electrically conductive layer surrounds the dielectric wall.

6. The magnetic memory element as in claim 1, wherein the dielectric wall contacts and surrounds the magnetic free layer and the electrically conductive structure contacts and surrounds the dielectric wall.

7. The magnetic memory element as in claim 1, wherein the dielectric wall and the non-magnetic barrier layer both comprises the same material.

8. The magnetic memory element as in claim 1, wherein the dielectric wall and the non-magnetic barrier layer both comprises MgO.

9. The magnetic memory element as in claim 1, further comprising circuitry for supplying a gate voltage to the electrically conductive layer during a write mode and removing the gate voltage from the electrically conductive layer during a read mode.

* * * * *